US012588320B2

(12) United States Patent     (10) Patent No.:   US 12,588,320 B2

Wang et al.          (45) Date of Patent:    Mar. 24, 2026

(54) MICRO LIGHT EMITTING DIODE, MICRO LIGHT EMITTING DEVICE, AND DISPLAY

(71) Applicant: XIAMEN SAN'AN OPTOELECTRONICS CO., LTD., Xiamen (CN)

(72) Inventors: Yenchin Wang, Xiamen (CN); Jinghua Chen, Xiamen (CN); Huanshao Kuo, Tianjin (CN); Shao-Hua Huang, Xiamen (CN); Shuiqing Li, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 531 days.

(21) Appl. No.: 17/662,379

(22) Filed: May 6, 2022

(65) Prior Publication Data

US 2022/0359787 A1      Nov. 10, 2022

(30) Foreign Application Priority Data

May 10, 2021    (CN) .......................... 202110506845.8

(51) Int. Cl.
     *H10H 20/82*       (2025.01)
     *H10H 20/01*       (2025.01)
     (Continued)

(52) U.S. Cl.
     CPC .......... *H10H 20/82* (2025.01); *H10H 20/013* (2025.01); *H01L 25/0753* (2013.01); *H10H 20/841* (2025.01)

(58) Field of Classification Search
None
See application file for complete search history.

(56) References Cited

U.S. PATENT DOCUMENTS 6,479,395 B1 * 11/2002 Smith ................. B81C 1/00357
                                            438/723
6,730,940 B1 * 5/2004 Steranka ................. H01L 33/46
                                      257/E33.068

(Continued)

FOREIGN PATENT DOCUMENTS

| CN | 109103315 A | 12/2018 |
|---|---|---|
| CN | 112382711 A | 2/2021 |
| WO | WO2019/098131 A1 * | 5/2019 |

OTHER PUBLICATIONS

Costanzo et al 2010, 'Benzocyclobutene as Substrate Material for Planar Millimeter-Wave Structures: Dielectric Characterization and Application', Journal of Infrared, Millimeter and Terahertz Waves, 31(1):66-77. (Year: 2010).*

(Continued)

*Primary Examiner* — Feifei Yeung Lopez

(74) *Attorney, Agent, or Firm* — MUNCY, GEISSLER, OLDS & LOWE, P.C.

(57)          ABSTRACT

A micro light emitting diode includes a semiconductor unit having a first surface and a second surface, and including a first type semiconductor layer, an active layer, and a second type semiconductor layer. The first surface has a roughened portion that is located within a projection of the active layer. The projection of the roughened portion has a projected area not greater than that of the active layer. A micro light emitting device and a display are also disclosed.

14 Claims, 11 Drawing Sheets

(51) Int. Cl.
   *H01L 25/075*      (2006.01)
   *H10H 20/841*      (2025.01)

(56)                References Cited

U.S. PATENT DOCUMENTS

| | | | |
|---|---|---|---|
| 2017/0069681 A1* | 3/2017 | Lee .......................... | H01L 33/62 |
| 2017/0133563 A1* | 5/2017 | Chung .................... | H01L 33/60 |
| 2019/0237630 A1* | 8/2019 | Check ..................... | H01L 33/46 |
| 2021/0074885 A1* | 3/2021 | Nakamura .......... | H01L 25/0753 |

OTHER PUBLICATIONS

Search Report appended to an Office Action, which was issued to
Chinese counterpart application No. 202110506845.8 by the CNIPA
on Feb. 23, 2022 with an English translation thereof.

\* cited by examiner

MICRO LIGHT EMITTING DIODE, MICRO LIGHT EMITTING DEVICE, AND DISPLAY

CROSS-REFERENCE TO RELATED APPLICATION

This application claims priority of Chinese Patent Application No. 202110506845.8, filed on May 10, 2021.

FIELD

The present disclosure relates to a micro light emitting diode, a micro light emitting device, and a display.

BACKGROUND

Micro light emitting diodes are used as a light source for display apparatus due to its several advantages, such as low power consumption, high brightness, high contrast ratio, great color saturation, high response time, and long life span etc. However, the micro light emitting diodes in a conventional display have relatively small size and a relatively large light emitting angle, so that light emitted from the micro light emitting diodes would interfere with each other, which may affect color performance and display quality of the conventional display.

SUMMARY

Therefore, an object of the disclosure is to provide a micro light emitting diode, a micro light emitting device, and a display that can alleviate or overcome the aforesaid shortcomings of the prior art.

According to a first aspect of the disclosure, a micro light emitting diode includes a semiconductor unit. The semiconductor unit has a first surface and a second surface that is opposite to the first surface, and includes a first type semiconductor layer, an active layer, and a second type semiconductor layer that are disposed on one another in such order from the first surface to the second surface. The first surface has a roughened portion. The roughened portion has a projection that is projected on an imaginary plane along a projection direction perpendicular to the first surface, and that is located within a projection of the active layer on the imaginary plane, the projection of the roughened portion having a projected area not greater than that of the active layer.

According to a second aspect of the disclosure, a light emitting device includes a substrate and at least one of the aforesaid micro light emitting diode.

According to a third aspect of the disclosure, a display includes a substrate and at least one of the aforesaid micro light emitting diode.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
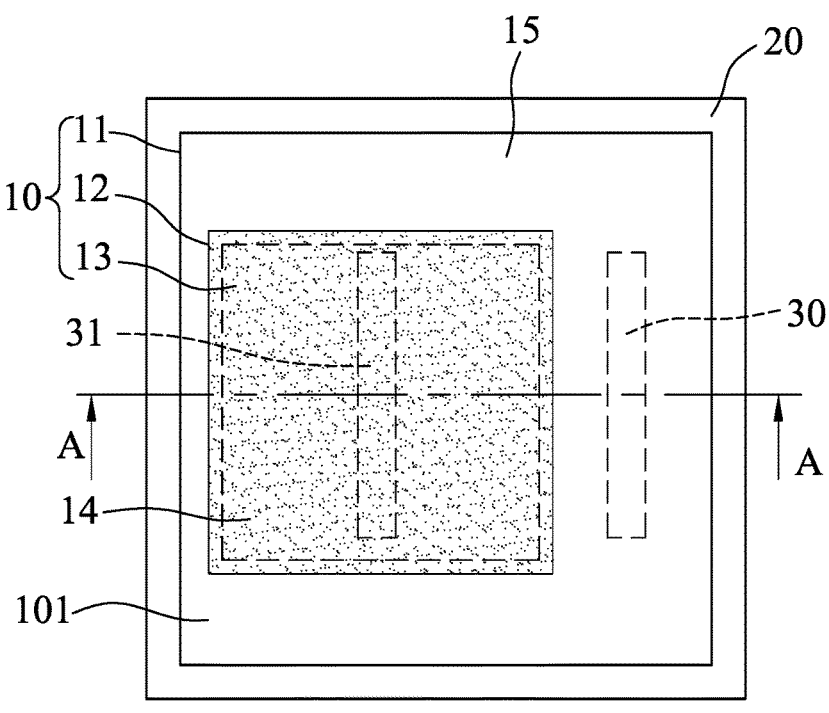
FIG. 1 is a top view illustrating an embodiment of a micro light emitting diode according to the present disclosure.

Before the disclosure is described in greater detail, it should be noted that where considered appropriate, reference numerals have been repeated among the figures to indicate corresponding or analogous elements, which may optionally have similar characteristics.

It should be noted that, the formation of a first component over or on a second component in the description below may include embodiments in which the first and second components are formed in direct contact, and may also include embodiments in which additional components may be formed between the first and second components, such that the first and second components may not be in direct contact.

Figure 2:
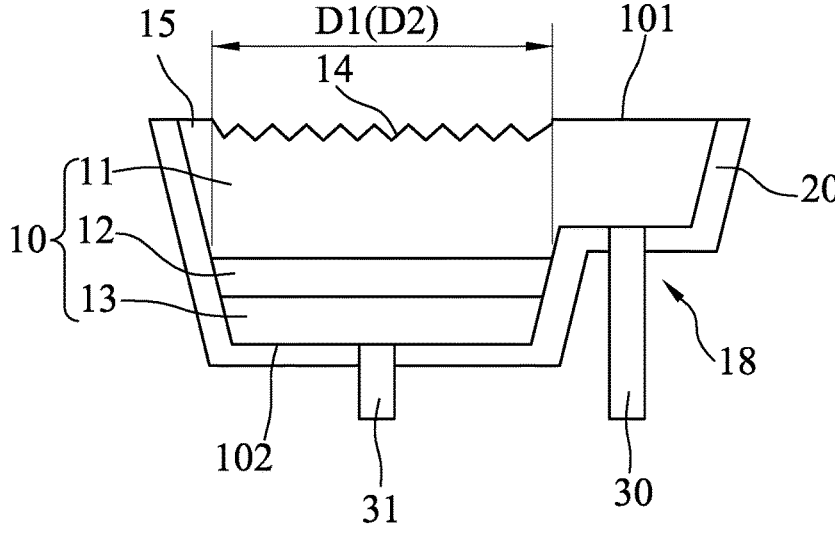
FIG. 2 is a sectional view taken along line A-A of FIG. 1.

Referring to FIGS. 1 and 2, an embodiment of a micro light emitting diode according to the present disclosure includes a semiconductor unit 10, first and second electrodes 30, 31, and an insulation layer 20. FIGS. 3 to 10 illustrate other embodiments of the micro light emitting diodes according to the present disclosure, each of which also includes the aforesaid elements but has different configurations in a roughed portion (will be described below) of the semiconductor unit 10.

The micro light emitting diode of each of the embodiments has a width and a length, and each of the width and the length ranges from 2 μm to 100 μm. In some embodiments, the aforesaid range may be one of 2 μm to 5 μm, 5 μm to 10 μm, 10 μm to 20 μm, 20 μm to 50 μm, and 50 μm to 100 μm.

Referring to FIGS. 1 and 2, the semiconductor unit 10 has a first surface 101 and a second surface 102 that is opposite to the first surface 101, and includes a first type semiconductor layer 11, an active layer 12, and a second type semiconductor layer 13 that are disposed on one another in such order from the first surface 101 to the second surface 102. In this disclosure, each of the width and the length mentioned above is in a direction substantially parallel to the first surface 101 of the semiconductor unit 10.

The term "first-type" refers to (a portion/layer of) the semiconductor unit 10 being doped with a first conductivity type dopant, and the term "second-type" refers to it being doped with a second conductivity type dopant that is opposite in conductivity type to the first conductivity type dopant. For instance, the first conductivity type dopant may be a p-type dopant, and the second conductivity type dopant may be an n-type dopant, and vice versa.

Referring to FIG. 2, the first surface 101 has a roughened portion 14, and the roughened portion 14 has a projection that is projected on an imaginary plane along a projection direction perpendicular to the first surface 101, and that is located within a projection of the active layer 12 on the imaginary plane. The projection of the roughened portion 14 has a projected area that is not greater than a projected area of the projection of the active layer 12. In some embodiments, the roughened portion 14 may be formed in a regular or irregular pattern.

Figure 3:
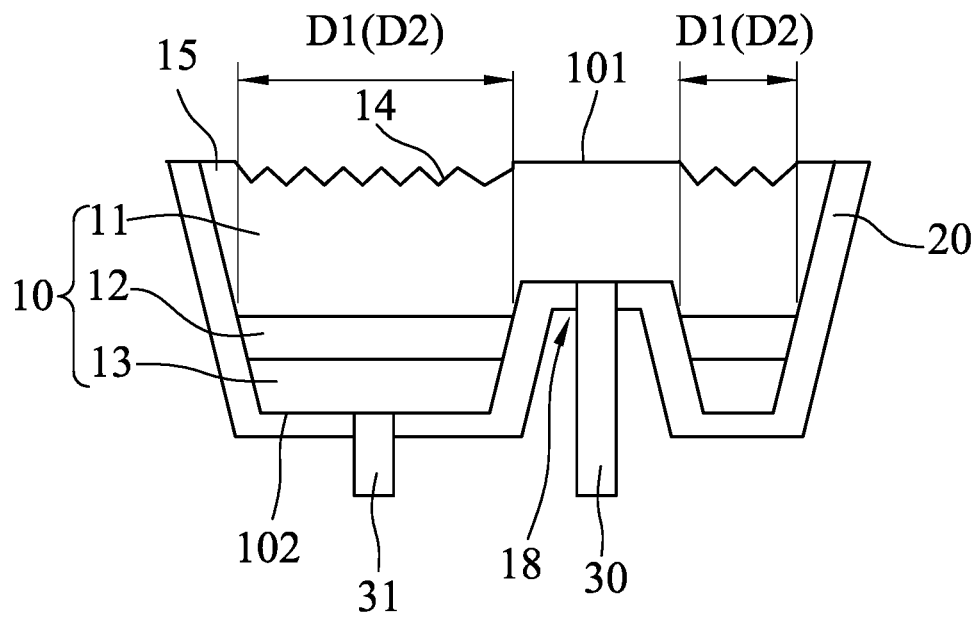
FIGS. 3 to 10 show variations of the micro light emitting diode shown in FIG. 2.
Figure 6:
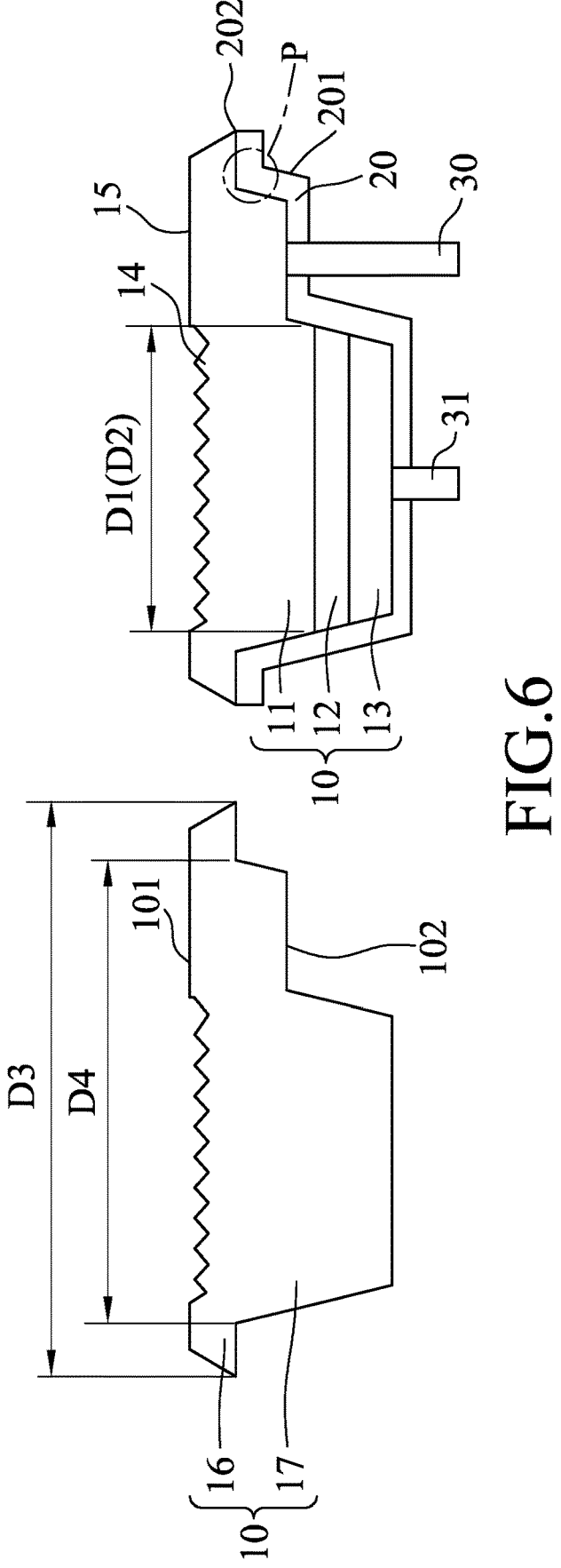
Figure 7:
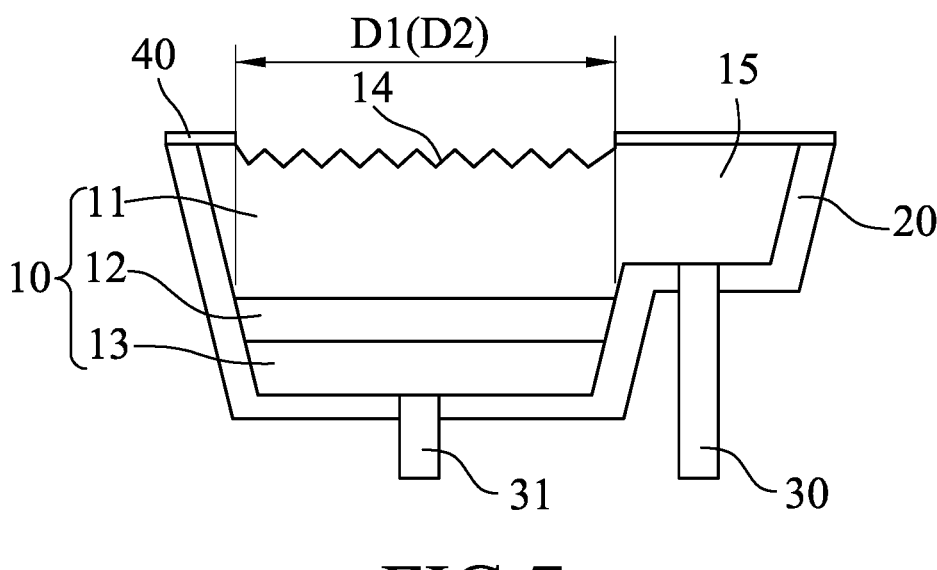

In some embodiments, referring to FIGS. 2, 3 and 6, the roughened portion 14 has a width (D1) equal to a width (D2)

of the active layer 12. In this case, the projected area of the roughened portion 14 is equal to the projected area of the active layer 12.

Figure 4:
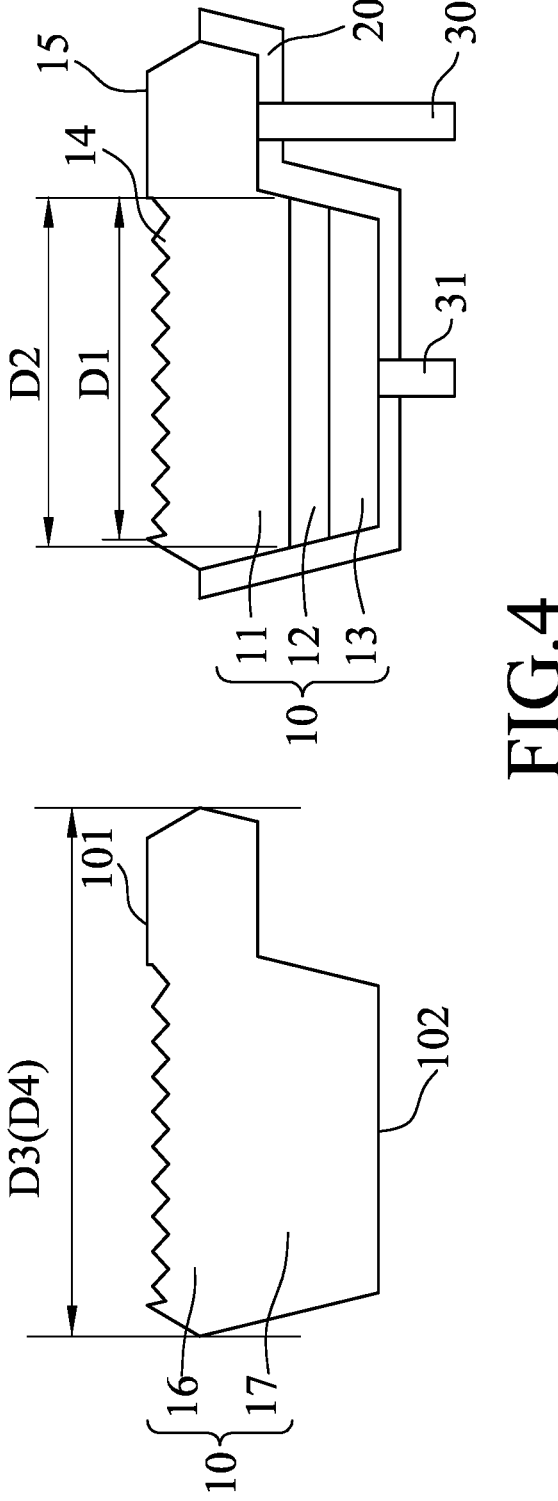
Figure 5:
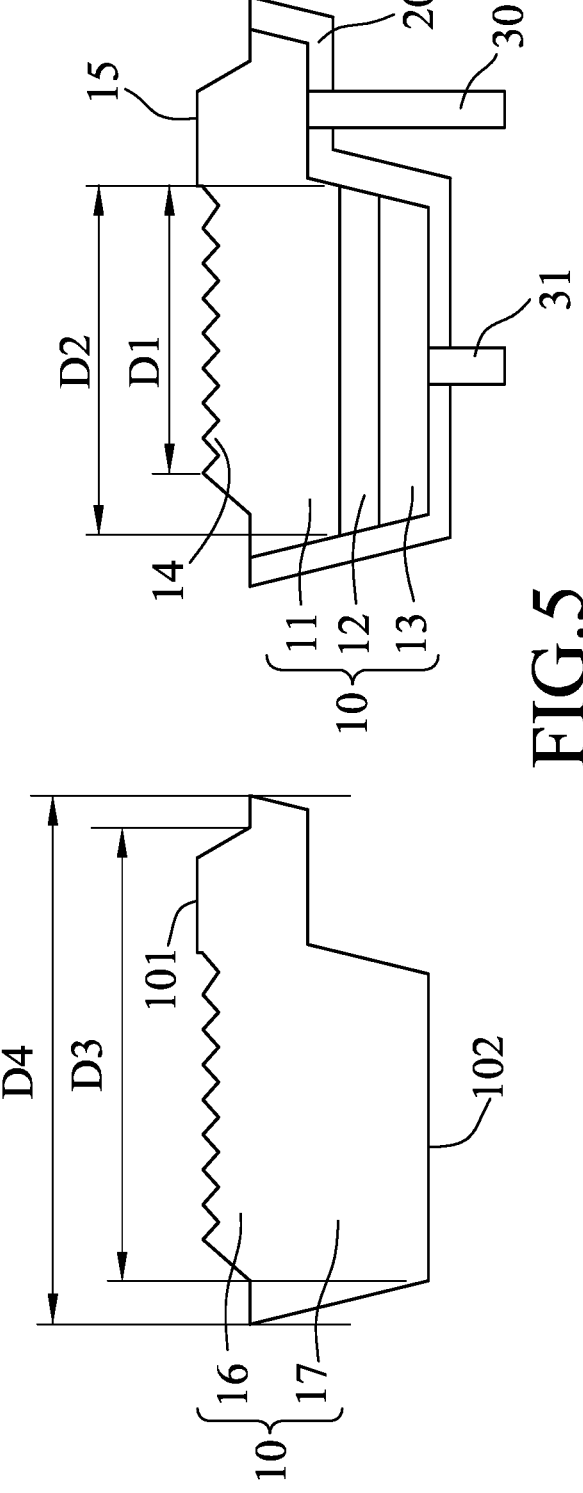

In other embodiments, referring to FIGS. 4 and 5, the width (D1) of the roughened portion 14 is less than the width (D2) of the active layer 12. In this case, the projected area of the roughened portion 14 is less than the projected area of the active layer 12. In certain embodiments, the projected area of the roughened portion 14 is not less than 60% of the projected area of the active layer 12. That is, in this disclosure, the projected area of the roughened portion 14 ranges from 60% to 100% of the projected area of the active layer 12.

Referring to FIG. 1, the first surface 101 further has a planar portion 15 that is outside of the roughened portion 14, and the roughened portion 14 has valleys that are indented toward the second surface 102.

Referring to FIGS. 2 and 3, the semiconductor unit 10 is formed with a recess 18 which is recessed from the second surface 102 toward the first surface 101, and which exposes the first type semiconductor layer 11. Moreover, the recess 18 can be formed on a peripheral region of the semiconductor unit 10 (see FIG. 2), or an inner region of the semiconductor unit 10 (see FIG. 3).

Referring to FIGS. 2 to 3, the first electrode 30 is disposed in the recess 18 and on the exposed first type semiconductor layer 11 so as to be electrically connected to the first type semiconductor layer 11 of the semiconductor unit 10. On the other hand, the second electrode 31 is disposed on the second surface 102 outside the recess 18 so as to be electrically connected to the second type semiconductor layer 13 of the semiconductor unit 10.

In this disclosure, each of the first and second type semiconductor layers 11, 13 is made of a material that has a refractive index ranging from 3 to 3.6. In this embodiment, aluminum gallium indium phosphide (AlGaInP) having a refractive index ranging from 3.2 to 3.6 is employed as the material for the first and second type semiconductor layers 11, 13. Moreover, the higher the refractive index of the first and second type semiconductor layers 11, 13, the better the total reflection of the planar portion 15 of the first surface 101 and a side wall of the semiconductor unit 10. Thus, light from the active layer 12 may mainly emit outwardly through the roughened portion 14 of the first surface 101 of the semiconductor unit 10, and the light emitting angle may be reduced.

Referring to FIGS. 1 to 3, the insulation layer 20 covers the second surface 102 of the semiconductor unit 10 and at least a part of the side wall of the semiconductor unit 10. In the embodiments shown in FIGS. 2 and 3, the insulation layer 20 covers the second surface 102 and the entire side wall of the semiconductor unit 10.

The insulation layer 20 may include one of silicon oxide, silicon nitride, titanium oxide, aluminum oxide, and combinations thereof. The insulation layer 20 may be configured as a distributed Bragg reflector (DBR) that includes at least one silicon oxide layer and at least one titanium oxide layer. In some embodiments, the insulation layer 20 has a refractive index ranging from 1.4 to 2.6. It should be noted that, when the difference in the refractive index between the insulation layer 20 and the first and second type semiconductor layers 11, 13 is larger, total reflection effect of the side wall of the semiconductor unit 10 becomes better, which facilitates emission of light mainly through the roughened portion 14 of the first surface 101.

Referring to FIGS. 4 to 6, in certain embodiments, the light-emitting unit 10 may be divided into a first section 16 that has the first surface 101, and a second section 17 that is connected to the first section 16 and has the second surface 102. A maximum width (D3) of the first section 16 may be equal to, less than, or greater than a maximum width (D4) of the second section 17. Specifically, FIG. 4 shows that the maximum width (D3) of the first section 16 is equal to the maximum width (D4) of the second section 17, FIG. 5 shows that the maximum width (D3) of the first section 16 is less than the maximum width (D4) of the second section 17, and FIG. 6 shows that the maximum width (D3) of the first section 16 is greater than the maximum width (D4) of the second section 17. In FIGS. 4 and 5, the insulation layer 20 covers the second surface 102 of the semiconductor unit 10 and a side wall of the second section 17 of the semiconductor unit 10, but does not cover the first section 16.

In the embodiment shown in FIG. 6, the insulation layer 20 covers the second surface 102 of the semiconductor unit 10, the side wall of the second section 17, and a bottom surface of a flange portion of the first section 16. The bottom surface of the flange portion of the first section 16 intersects the side wall of the second section 17 and extends outwardly from an end of the side wall of the second section 17. The intersection (P) of the bottom surface of the flange portion and the end of the side wall of the second section 17 is located within a projection of the semiconductor layer 10 on an imaginary plane in which the intersection (P) lies/(or) is laid, and is located distal to the roughened portion 14. Moreover, a minimum distance of the intersection (P) and an edge of the semiconductor unit 10 is not less than 0.5 µm. In this case, in an etching process for forming the roughened portion 14, the flange portion of the first section 16 exceeding the intersection (P) can prevent the insulation layer 20 from being damaged by an etchant (e.g. an etching liquid), so that the total reflection of the insulation layer 20 can be improved.

Furthermore, a thickness of the first section 16 is not less than 0.5 µm. If the thickness of the first section 16 is less than 0.5 µm, the etchant may penetrate through the flange portion to the insulation layer 20, so that the insulation layer 20 would not be protected by the first section 16 during the process of roughening the first surface 101.

Referring to FIGS. 7 to 10, in certain embodiments, the micro light emitting diode further includes a protection layer 40 covering the planar portion 15 of the first surface 101 of the semiconductor unit 10. In some embodiments, the protection layer 40 is formed such that only the roughened portion 14 of the first surface 101 is exposed but the planar portion 15 is completely covered. That is one end of the protection layer 40 is flush with a boundary between the roughened portion 14 and the planar portion 15, and the other end of the protection layer 40 is flushed with or exceeds an outer edge of the insulation layer 20 formed on the side wall of the semiconductor unit 10. The protection layer 40 includes one of silicon oxide, silicon nitride, aluminum oxide, and combinations thereof, and is formed by chemical vapor deposition (CVD) or atomic layer deposition. In this embodiment, the protection layer 40 has a thickness ranging from 100 Å to 20000 Å.

Figure 8:
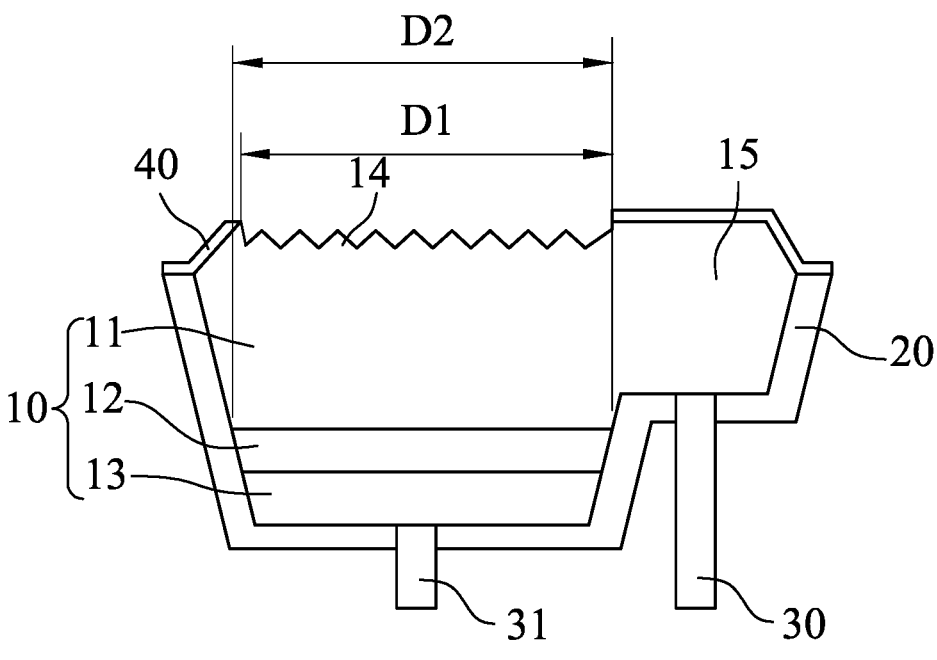
Figure 9:
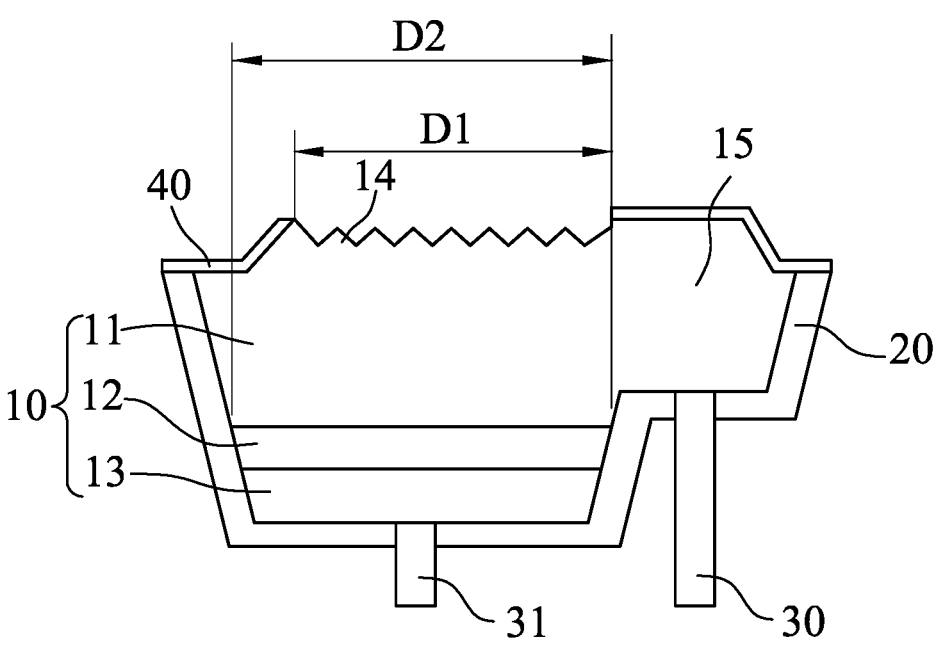
Figure 10:
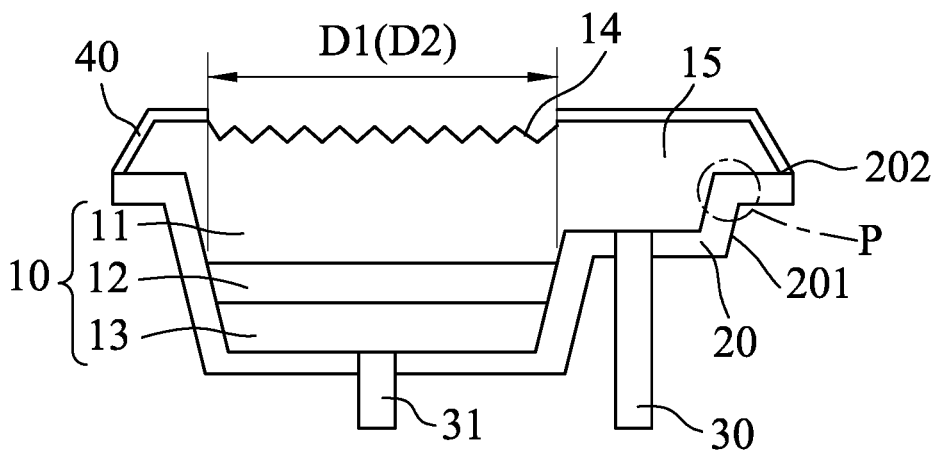

In FIGS. 8 to 10, the protection layer 40 also covers a part of the side wall of the semiconductor unit 10 that is not covered by the insulation layer 20.

FIGS. 13 to 19 illustrate a process for manufacturing the micro light emitting diode shown in FIG. 4.

Figure 13:
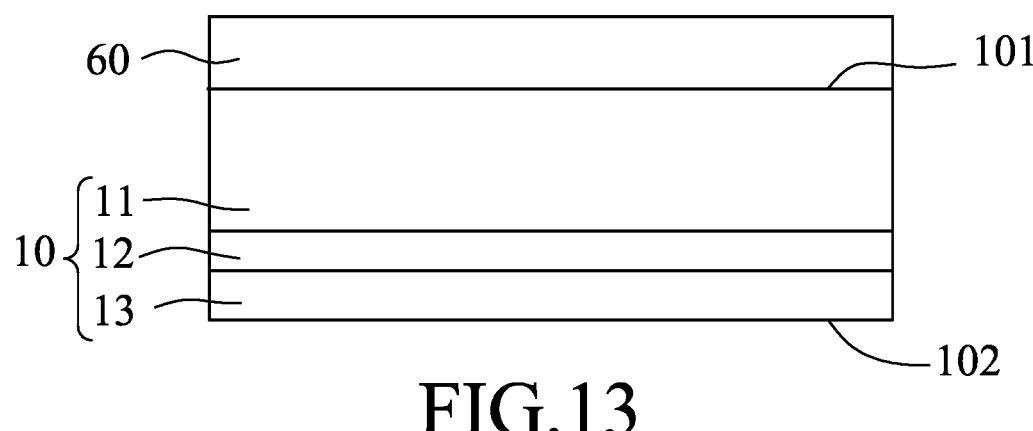
FIGS. 13 to 19 show steps in a process for manufacturing the micro light emitting diode shown in FIG. 4.

In step 1, referring to FIG. 13, a growth substrate 60 which is made of gallium arsenide (GaAs) is provided. Then, the first type semiconductor layer 11, the active layer 12, and the second type semiconductor layer 13, are sequentially formed on the growth substrate 60 by the chemical vapor deposition. Thus, the semiconductor unit 10 is formed on the growth substrate 60. The first surface 101 of the semiconductor unit 10 is adjacent to or in contact with the growth substrate 60, and the second surface 102 of the semiconductor unit 10 is distal from the growth substrate 60.

Figure 14:
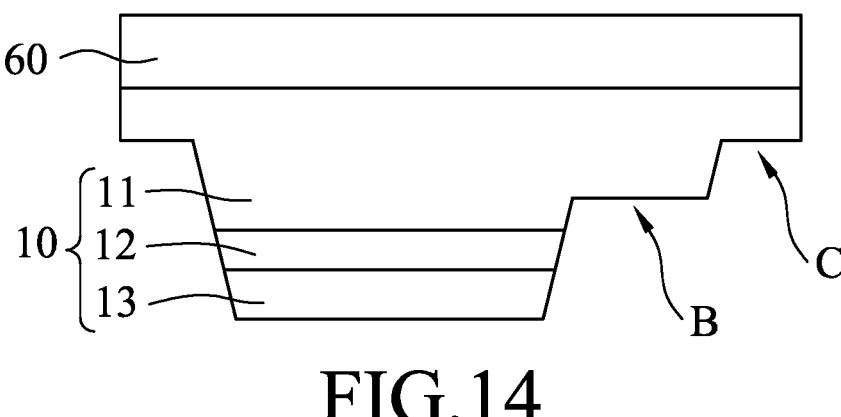

In step 2, referring to FIG. 14, the semiconductor unit 10 is etched from the second surface of the semiconductor unit 10 to remove a part of the first type semiconductor layer 11, a part of the active layer 12, and a part of the second type semiconductor layer 13, and to expose the first type semiconductor layer 11. The exposed first type semiconductor layer has a mesa area (B) and a dicing area (C) surrounding the mesa area (B). The first type semiconductor layer 11 is graduated in thickness, and is less thick at the dicing area (C) than at the mesa area (B).

Figure 15:
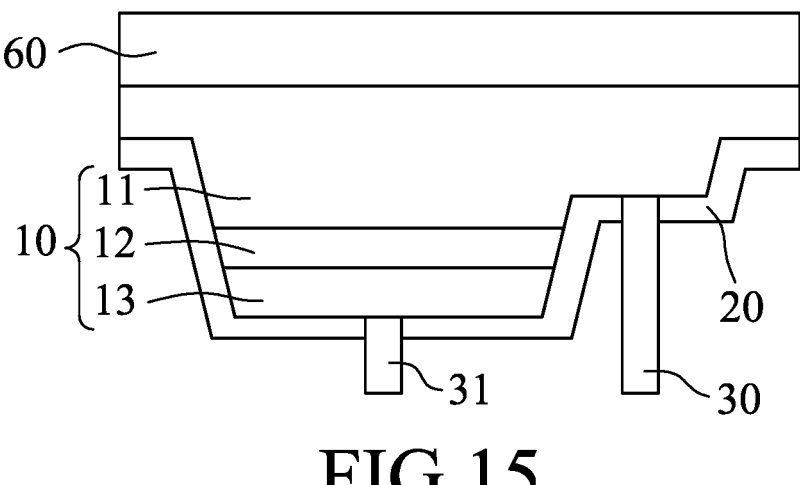

In step 3, referring to FIG. 15, the insulation layer 20 is formed to cover the etched semiconductor unit 10 (including the mesa area (B) and the dicing area (C)). Then, first and second through holes are formed in the insulation layer 20 to expose the first type semiconductor layer 11 and the second type semiconductor layer 13 of the semiconductor unit 10, respectively.

In step 4, further referring to FIG. 15, the first and second electrodes 30, 31 are formed on the insulation layer 20, and respectively extend through the first and second through holes so as to electrically connect to the first type semiconductor layer 11 and the second type semiconductor layer 13, respectively.

Figure 16:
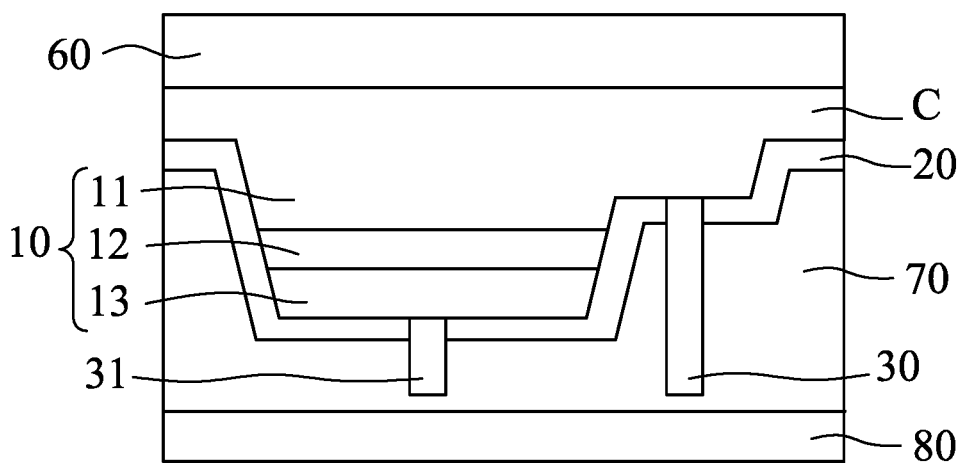

In step 5, referring to FIG. 16, a sacrificial layer 70 is formed to cover the insulation layer 20 and the first and second electrodes 30, 31. Then, a transferring substrate 80 is formed on the sacrificial layer 70 opposite to the semiconductor unit 10.

Figure 17:
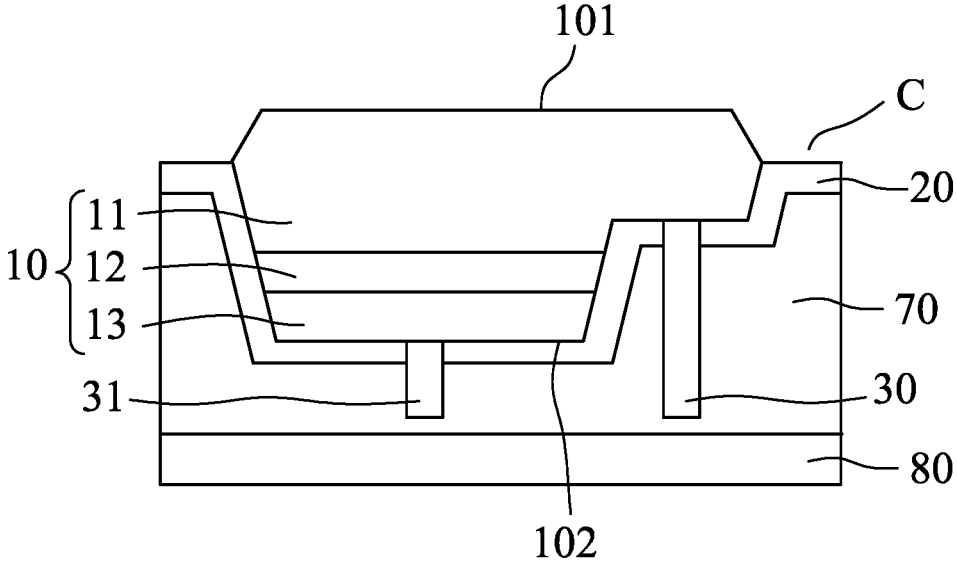

In step 6, referring to FIG. 17, the growth substrate 60 is removed to expose the first surface 101. Then, the first semiconductor layer 11 at the dicing area (C) is removed to expose the underlying insulation layer 20. By controlling a removal ratio of the semiconductor material, the exposed underlying insulation layer 20 is flush with an outermost edge of the semiconductor unit 10.

Figures 18, 19:
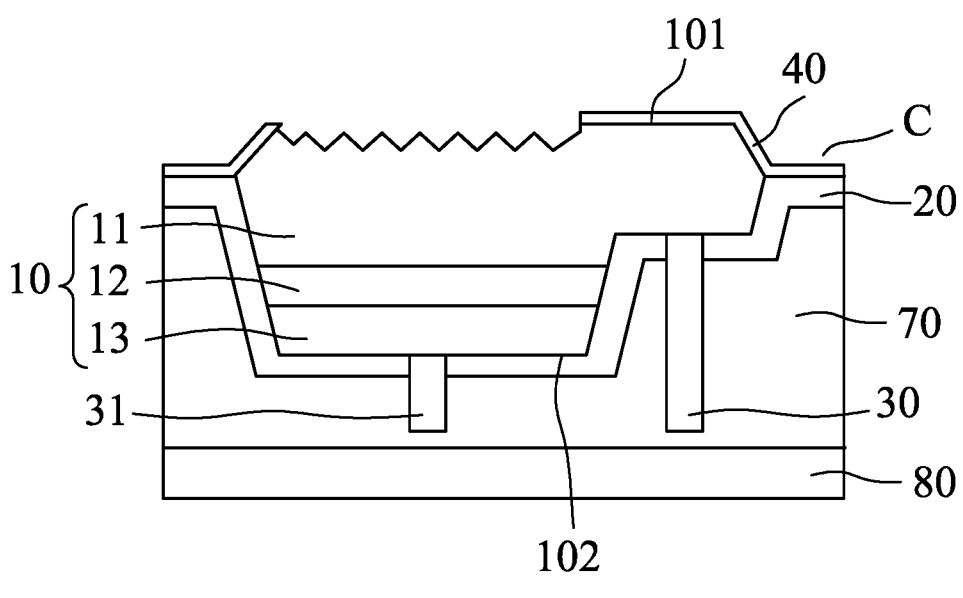

In step 7, referring to FIG. 18, the protection layer 40 is formed by chemical vapor deposition (CVD) or atomic layer deposition on the insulation layer 20 at the dicing area (C) and a part of the first surface 101 of the light-emitting unit 10 which is not corresponding in position to the active layer 12. Then, another part of the first surface 101 which is not covered by the protection layer 40 is roughened by wet etching, dry etching, or a combination thereof to form the roughened portion 14 as shown in FIG. 18. The part of the first surface 101 covered by the protection layer 40 is the aforesaid planar portion 15.

In this embodiment, wet etching is preferably used to form the roughened portion 14. It should be noted that, due to the protection layer 40, the insulation layer 20 and the planar portion 15 of the first surface 101 would not be exposed to the etchant during the roughening process, and would not be roughened.

In step 8, referring to FIG. 19, the protection layer 40 is removed. After that, the sacrificial layer 70 and the transferring substrate 80 are removed. Then, the insulation layer 20 at the dicing area (C) is removed, so as to obtain the micro light emitting diode as shown in FIG. 4.

Alternatively, after the protection layer 40 is removed, the semiconductor unit 10 may be transferred to a further substrate (not shown) with the first surface 101 facing the further substrate, followed by removing the sacrificial layer

70 and the transferring substrate 80. Afterward, the further substrate is removed to obtain the micro light emitting diode as shown in FIG. 4.

It should be noted that, the micro light emitting diode shown in FIGS. 2, 3, 5 to 10, may also be obtained by the abovementioned manufacturing process. For instance, if the first semiconductor layer 11 at the dicing area (C) is completely removed in the aforesaid step 2, the micro light emitting diode as shown in FIGS. 2 and 3 can be obtained. If the removal rate of the first semiconductor layer 11 is adjusted to control the width of the first section 16 of the semiconductor unit 10 in the aforesaid step 6, the micro light emitting diode as shown in FIGS. 5 and 6 can be obtained. If the protection layer 40 is not removed in the aforesaid step 8, the micro light emitting diode as shown in FIGS. 7 to 10 can be obtained.

Figure 11:
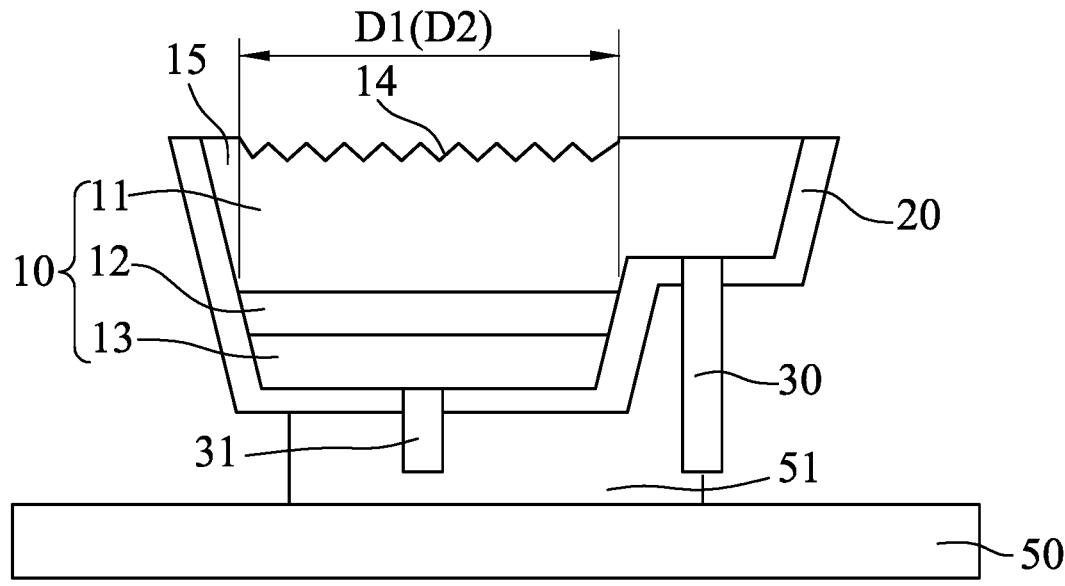
FIG. 11 is a sectional view illustrating an embodiment of a micro light emitting device according to the present disclosure.
Figure 12:
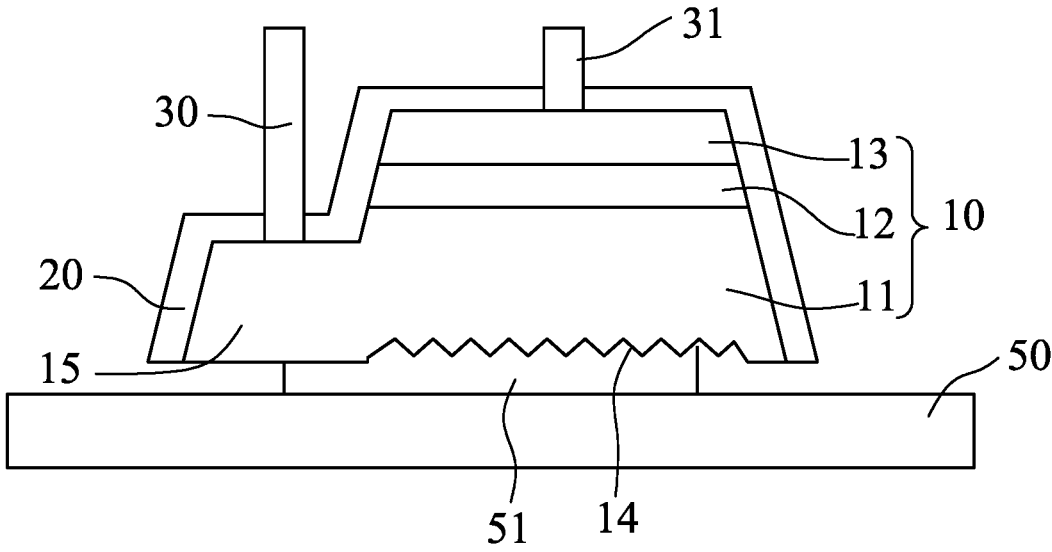
FIG. 12 shows a variation of the micro light emitting device shown in FIG. 11.

Referring to FIGS. 11 and 12, different embodiments of micro light emitting devices according to the present disclosure are provided. Each of the micro light emitting devices includes a substrate 50, and at least one aforementioned micro light-emitting diode.

The substrate 50 may be made of one of metal, sapphire, glass, silicon, silicon carbide, and combinations thereof. In such a case, referring to FIGS. 11 and 12, an adhesive film 51 may be disposed between the substrate 50 and the micro light-emitting diode as a connection member, and is made of, e.g., polyimide (PI), acrylic resin, etc. The adhesive film 51 may be design to be decomposed by UV light, e.g., at a wavelength of not greater than 360 nm, so that the substrate 50 and the micro light-emitting diode could be separated after the UV light treatment. The adhesive film 51 may be used for transferring the micro light-emitting diode from one substrate to another substrate. In some embodiments, the adhesive film 51 may absorb the UV light with a wavelength of 360 nm or less, and has a transmittance of less than 10% at this wavelength. In certain embodiments, the UV light with a wavelength of 300 nm is used for transferring the micro light-emitting diode.

Furthermore, the adhesive film 51 has a width along a direction parallel to the first surface 101 of the semiconductor unit 10, a thickness along the projection direction, and a projection on the imaginary plane. The width of the adhesive film 51 may be greater than, equal to or smaller than a width of the semiconductor unit 10. The thickness of the adhesive film 51 may range from 0.1 μm to 2 μm, e.g., from 0.1 μm to 0.5 μm. In some embodiments, the thickness of the adhesive film 51 may be less than 0.1 μm to alleviate light absorbance issues of the adhesive film 51. In some embodiments, the width of the adhesive film 51 is less than the width of the semiconductor unit 10, and a projected area of the adhesive film 51 ranges from 80% to 90% of the projected area of the semiconductor unit 10.

In some embodiments, the substrate 50 is a supporting film which is made of benzocyclobutene (BCB) or a material having good chemical stability.

The present disclosure also provides an embodiment of a display which includes a substrate and at least one aforesaid light-emitting diode.

In sum, by virtue of the roughened portion 14 formed on the first surface 101 of the semiconductor unit 10 corresponding in position to the active layer 12, and the non-roughened planar portion 15 and side wall of the semiconductor unit 10, light will mainly emit outwardly through the roughened portion 14 and the light emitting angle will be reduced. Thus, in the micro light emitting device or the micro light emitting diode display, lights emitted from different micro light emitting diodes (e.g., red, green, and blue light emitted from a red micro light emitting diode, a green micro light emitting diode, and a blue micro light emitting diode, respectively) would not interfere with each another, so that color performance and display quality thereof can be enhanced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A micro light emitting diode comprising:
a semiconductor unit having a first surface and a second surface that is opposite to said first surface, and including a first type semiconductor layer, an active layer, and a second type semiconductor layer that are disposed on one another in such order from said first surface to said second surface, said first type semiconductor layer including a flange portion; and
an insulation layer,
wherein said first surface has a roughened portion, said roughened portion having a projection that is projected on an imaginary plane along a projection direction perpendicular to said first surface, and that is located within a projection of said active layer on the imaginary plane, the projection of said roughened portion having a projected area not greater than that of said active layer and not less than 60% of that of said active layer,
wherein said semiconductor unit is divided into a first section that has said first surface and said flange portion, and a second section that is connected to said first section and has said second surface,
wherein said insulation layer covers said second surface of said semiconductor unit, a side wall of said second section, and a bottom surface of said flange portion of said first section, wherein said bottom surface of said flange portion is opposite to said first surface,
wherein said bottom surface of said flange portion intersects said side wall of said second section and extends outwardly from an end of said side wall of said second section, and
wherein an intersection of said bottom surface of said flange portion and said end of said side wall of said second section is covered by said insulation layer, and said intersection is located within a projection of said semiconductor unit on an imaginary plane in which said intersection lies.

2. The micro light emitting diode as claimed in claim 1, which has a width and a length, each of the width and the length ranging from 2 μm to 100 μm.

3. The micro light emitting diode as claimed in claim 1, wherein said insulation layer is configured as a distributed Bragg reflector.

4. The micro light emitting diode as claimed in claim 1, wherein said insulation layer has a refractive index ranging from 1.4 to 2.6.

5. The micro light emitting diode as claimed in claim 1, wherein said first surface further has a planar portion that is outside of said roughened portion, said roughened portion having valleys that are indented toward said second surface.

6. The micro light emitting diode as claimed in claim 5, further comprising a protection layer covering said planar portion of said first surface.

7. The micro light emitting diode as claimed in claim 6, wherein said protection layer includes one of silicon oxide, silicon nitride, aluminum oxide, and combinations thereof.

8. The micro light emitting diode as claimed in claim 6, wherein said protection layer has a thickness ranging from 100 Å to 20000 Å.

9. A micro light emitting device comprising:
a substrate; and
at least one micro light emitting diode as claimed in claim 1.

10. The micro light emitting device as claimed in claim 9, wherein said substrate is made of one of metal, sapphire, glass, silicon, silicon carbide, and combinations thereof.

11. The micro light emitting device as claimed in claim 9, said substrate is a supporting film made of benzocyclobutene.

12. The micro light emitting device as claimed in claim 9, wherein said first surface further has a planar portion that is outside of said roughened portion, said roughened portion having valleys that are indented toward said second surface.

13. The micro light emitting device as claimed in claim 9, further comprising a protection layer covering said planar portion of said first surface.

14. A display comprising:
a substrate; and
at least one micro light emitting diode as claimed in claim 1.

* * * * *